United States Patent [19]

Fox

[11] Patent Number: 4,612,596
[45] Date of Patent: Sep. 16, 1986

[54] CIRCUIT FOR STABILIZING ELECTROMAGNET COIL CURRENT OF A MAGNETIC RESONANCE IMAGING DEVICE

[75] Inventor: Timothy R. Fox, Chicago, Ill.

[73] Assignee: Kabushiki Kaisha Toshiba, Kawasaki, Japan

[21] Appl. No.: 712,736

[22] Filed: Mar. 18, 1985

[51] Int. Cl.⁴ .......................... G01R 33/22; H01F 7/20
[52] U.S. Cl. ..................................... 361/146; 324/322
[58] Field of Search .............................. 361/143, 146; 324/318–320, 322; 363/74, 75, 79, 90

[56] References Cited

U.S. PATENT DOCUMENTS

| | | | |
|---|---|---|---|
| 2,735,044 | 2/1956 | Macleish | 361/146 |
| 2,787,737 | 4/1957 | Macleish | 361/146 |
| 3,450,952 | 6/1969 | Nelson | 361/146 |

Primary Examiner—L. T. Hix
Assistant Examiner—David M. Gray
Attorney, Agent, or Firm—Finnegan, Henderson, Farabow, Garrett & Dunner

[57] ABSTRACT

A circuit for stabilizing the electromagnet coil current of a magnetic resonant imaging device is provided which comprises a variable DC power supply coupled to provide current through the series combination of the primary winding of a DC current transformer, the electromagnet coil of the magnetic resonance imaging device, and a sense resistor. Changes in voltage across the sense resistor are monitored to provide rapid reaction to changes in the electromagnet coil current and the output of the DC current transformer is monitored to detect the absolute value of the electromagnet coil current. These two monitored signals are used to control the DC power supply in a manner which stabilizes the resultant electromagnet coil current.

4 Claims, 1 Drawing Figure

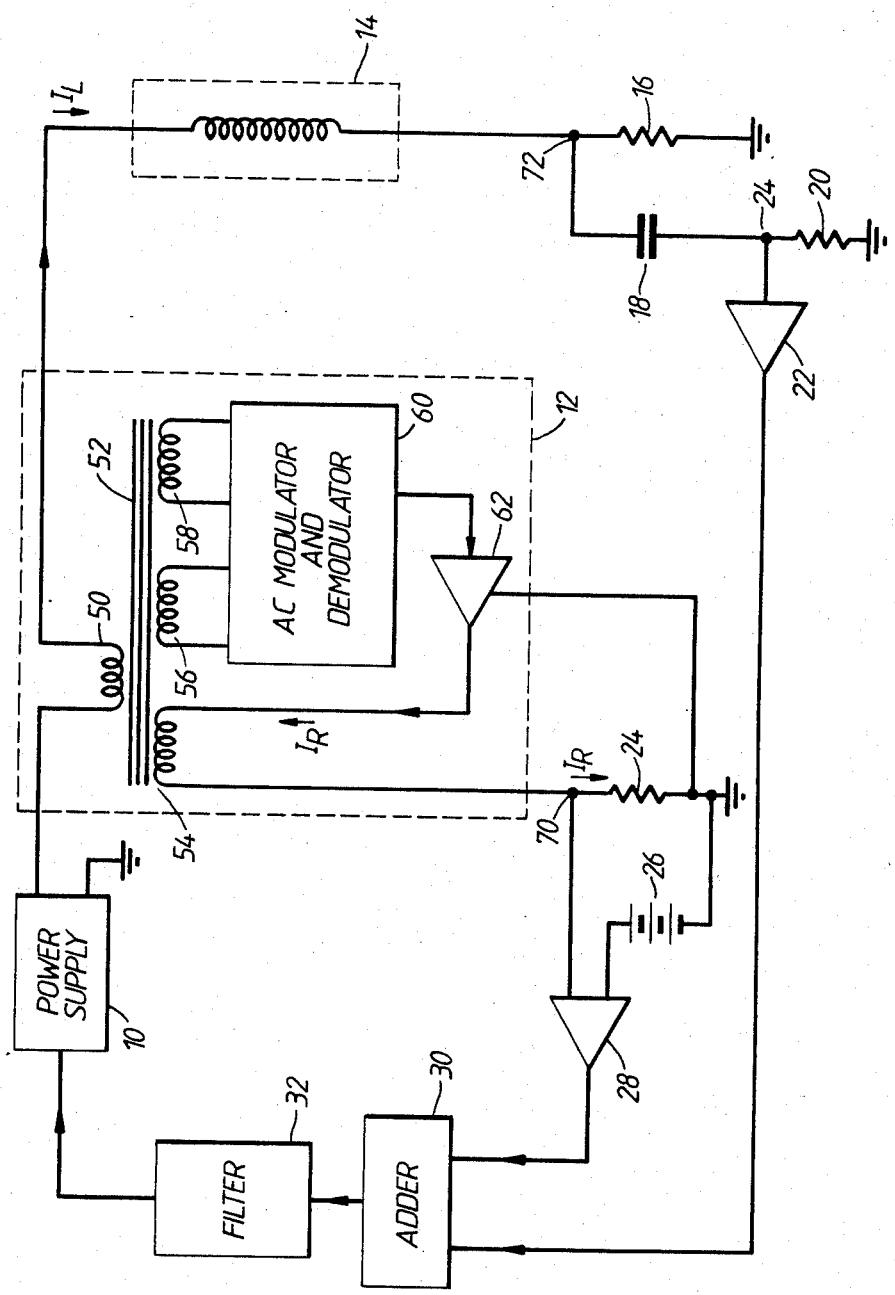

CIRCUIT FOR STABILIZING ELECTROMAGNET COIL CURRENT OF A MAGNETIC RESONANCE IMAGING DEVICE

BACKGROUND OF THE INVENTION

I. Field of the Invention

The present invention relates to a circuit for controlling the current delivered through a magnetic coil of an electromagnet used in a magnetic resonance imaging device.

II. Background Information

Magnetic resonance imaging devices are known which employ large electromagnets. These electromagnets typically comprise resistive coils that are configured in a Helmholtz coil approximation. In order to generate the requisite magnetic field along the axis of such coils, a constant current of approximately 200 amperes is typically required to be delivered into the coils.

A major problem in stabilizing the current delivered to such prior art devices centers around the necessity of measuring this current accurately. A typical method of measuring such current is to pass the current through a sense resistor. The voltage developed across this sense resistor is then compared with a standard voltage and an error signal is used to control the level of current supplied. A problem with this method is that the power dissipated in the sense resistor at high current levels heats the resistor and causes changes in the resistance as well as thermoelectric voltage errors in the resultant output voltage.

It is, accordingly, an object of the present invention to provide a circuit for stabilizing electromagnet coil current of magnetic resonance imaging devices.

More specifically, an object of the present invention is to provide a circuit for stabilizing the electromagnet coil current of a magnetic resonance imaging device which has improved insensitivity to resistance and thermoelectric voltage errors.

A still further object of the present invention is to provide a circuit for stabilizing the electromagnet coil current of a magnetic resonance imaging device which provides a stabilization better than one part per million.

Additional objects and advantages of the invention will be set forth in the description which follows, and in part will be obvious from the description or may be learned by practice of the invention.

SUMMARY OF THE INVENTION

To achieve the foregoing objects, and in accordance with the purposes of the invention as embodied and broadly described herein, a circuit for stabilizing the electromagnet coil current of a magnetic resonance imaging device is provided which comprises: a variable DC power supply having an output responsive to a control signal; a DC current transformer, including a ferromagnetic core and a primary winding, for producing a first sample signal which is proportional to current passing through the primary winding; a sense resistor; means for passing current from the variable DC current supply in series through the primary winding of the DC current transformer, the electromagnet coil of the magnetic resonance imaging device, and the sense resistor; means for obtaining a second sample signal which is proportional to change in the value of voltage developed across the sense resistor; and means responsive to the first and second sample signals for producing the current control signal for the variable DC power supply to stablize the current through the electromagnet coil. Preferably, the means for obtaining a second sample signal comprises a resistive/capacitive circuit connected in parallel with the sense resistor.

Alternatively described, the subject invention comprises a first resistor; a second resistor; a variable DC power supply having an output responsive to a control signal; a DC current transformer including a ferromagnetic core and a primary winding, the transformer being adapted to produce a sample current signal which is proportional to current passing through the primary winding; a magnetic resonance imaging device electromagnet coil; means for coupling current from the variable DC power supply through a series combination of the primary winding of the DC current transformer, the electromagnet coil, and the first resistor to produce a first voltage across the first resistor; means for coupling the sample current signal from the DC current transformer through the second resistor to produce a second voltage across the second resistor; and means responsive to the change in value of the first voltage and to the actual value of the second voltage to produce the control signal for the variable DC power supply.

BRIEF DESCRIPTION OF THE DRAWING

The drawing is a schematic block diagram of the preferred embodiment of the subject invention.

DESCRIPTION OF THE PREFERRED EMBODIMENT

Reference will now be made in detail to the present preferred embodiment of the invention as illustrated in the accompanying drawing.

The circuit of the drawing includes a variable DC power supply 10, a DC current transformer 12, an electromagnet coil 14, a resistor 16, a resistive/capacitive circuit comprising capacitor 18 and resistor 20, an amplifier 22, resistor 24, reference voltage source 26, differential amplifier 28, adder 30, and filter 32.

Magnetic coil 14 may, for example, comprise a resistive coil configured in a Helmholtz approximation for use in a magnetic resonance imaging device. Accordingly, coil 14 requires a constant supply current $I_L$ on the order of 200 amperes. The subject invention is designed to stabilize this current $I_L$ through coil 14 to a degree better than one part per million.

In order to achieve this degree of stabilization, DC current transformer 12 is coupled in series with coil 14. More specifically, DC current transformer 12 comprises a primary DC winding 50, an iron core 52, a secondary DC winding 54, a transmit coil 56, a receive coil 58, an AC modulator and demodulator 60, and a DC amplifier 62.

As should be well known to those skilled in the art, DC current transformer 12 is of a conventional configuration and operation. For example, a one kilohertz signal may be generated by AC modulator and demodulator 60 in transmit coil 56 and receive coil 58 may be tuned to receive a two kilohertz signal. AC modulator and demodulator 60 operates in conjunction with amplifier 62 to adjust the current $I_R$ through secondary winding 54 until there is zero two kilohertz signal received in receive coil 58. Under these conditions, there is zero total DC flux in the iron core and the relationship between $I_R$ and $I_L$, which passes through primary winding 50, is:

$$N_1 \cdot I_L = N_2 \cdot I_R,$$

where $N_1$ is the number of turns in primary winding 50 and $N_2$ is the number of turns in secondary winding 54.

As a consequence, with the primary coil 50 of DC current transformer 12 coupled in series with the output of power supply 10 and magnetic coil 14, the amount of current $I_L$ through magnetic coil 14 is proportional to the amount of current $I_R$ passing through secondary winding 54 of transformer 12.

Secondary winding 54 is coupled in series with resistor 24 so that current $I_R$ passes through resistor 24 producing a voltage drop across resistor 24. For example, if the resistance of resistor 24 is selected to be $R_S$, then the voltage $V_S$ across resistor 24 is equal to the product of $I_R$ times the resistance $R_S$. With one side of resistor 24 coupled to ground as shown in the drawing this voltage $V_S$ appears at node 70 at which resistor 24 is coupled to coil 54 of transformer 12.

Node 70 is also coupled to an input of differential amplifier 28. A second input of differential amplifier 28 is coupled to receive a reference voltage $V_R$ from power source 26. Accordingly, the output of differential amplifier 28 is proportional to the voltage $V_S$ which appears across resistor 24 which is, in turn, proportional to the current $I_R$ appearing in coil 54 which is, in turn, proportional to current $I_L$ passing through magnetic coil 14.

Depending upon the precise relationship between the number of turns $N_1$ of primary winding 50 and the number of turn $N_2$ of secondary winding 54, current $I_R$ may be made substantially less than current $I_L$. For example, if $N_1$ is a single turn and $N_2$ equals 1000 turns, and $I_L$ is 200 amperes, $I_R$ passing through resistor 24 would be on the order of 200 milliamperes since:

$$I_R = I_L \cdot (N_1/N_2)$$

The measurement of $V_S$ is, accordingly, basically insensitive to temperature change since the ratio of $N_1$ to $N_2$ is a constant physical relationship and since the amount of current which passes through resistor 24, namely current $I_R$, is sufficiently low (on the order of 200 milliamperes) that there is no overheating of resistor 24 which could cause resistance variation and thermoelectric errors. Resistor 24 is chosen to give a sufficiently high voltage (preferably 2-10 volts) applied to amplifier 28, so that the errors in amplifier 28 are negligible.

The output of differential amplifier 28, which is in effect, an error signal representing the difference between the desired voltage $V_R$ across resistor 24 and the measured voltage $V_S$ across resistor 24, is coupled to one input of adder 30.

Unfortunately, DC current transformers of the type presently available commerically are relatively slow in response time. For example, AC modulator and demodulator 60, given the frequencies discussed above, has a slow response since sampling occurs only at a one kilohertz rate. Accordingly, AC modulator and demodulator 60 can respond no faster than approximately one millisecond and may, in fact, not fully respond until approximately 10 milliseconds to changes in current $I_L$. To overcome this deficiency, and in accordance with the present invention, a sense resistor is coupled in series with the magnetic coil of the magnetic resonance device and a circuit is coupled to that sense resistor to detect the instantaneous voltage change across that resistor.

More specifically as shown by way of example and not limitation in the drawing, sense resistor 16 is coupled in series with magnetic coil 14 to receive current $I_L$. Resistor 16 may be, for example, on the order of 0.02 ohms. Accordingly, resistor 16 operates as a typical prior art sense resistor and is subject to typical prior art sense resistor changes in resistance and thermoelectric voltage errors. Resistor 16 may, for example, comprise a single sheet or plate of alloy, such as copper and iron, and may be located in a water bath in an attempt to dissipate the generated heat.

However, unlike prior art sense resistors, resistor 16 is not employed to detect the absolute value of current $I_L$, but rather is simply employed to detect substantially instantaneous changes in current $I_L$. To this end, a resistive/capacitive circuit comprising the series connection of capacitor 18 and resistor 20 is connected in parallel across resistor 16. Specifically, one end of capacitor 18 is coupled to common node 72 of resistor 16 and magnetic coil 14 while the other end of capacitor 18 is coupled at node 74 to one end of resistor 20. The opposite end of resistor 20 is coupled to ground which forms a return path for power supply 10.

With this interconnection, the instantaneous voltage across sense resistor 16 is communicated to resistor 20 and sensed at node 74 by amplifier 22. However, due to the interposition of capacitor 18 between nodes 72 and 74, there is no response to average DC voltage level at node 72 communicated to node 74. Since only the instantaneous voltage change across resistor 16 is monitored, DC stability of resistor 16 is unimportant to the effective operation of the overall circuit.

The output of amplifer 22 is coupled to a second input of adder 30 so that the output of adder 30 is responsive both to the instantaneous change of current $I_L$ sensed across resistor 16 and the absolute value of current $I_L$ across resistor 24.

The precise values of capacitor 18 and resistor 20 should be chosen so that the effect of any change in current $I_L$ detected across resistor 20 decreases as the effect of any change in current $I_L$ begins to be detected across resistor 24. For example, the time constant of capacitor 18 and resistor 20 may be chosen to be on the order of 1 millisecond.

Adder 30, as noted before, operates to combine the outputs from amplifiers 22 and 28. The precise ratio of combination depends, as should be understood by those skilled in the art, on the conversion gains of the two circuits comprising amplifiers 22 and 28.

The output of adder 30 is coupled to a control input terminal of variable power supply 10 through feedback loop filter 32. Filter 32 controls phase shifts in the feedback loop to avoid oscillations. Accordingly, the output of adder 30 operates as a control signal to variable power supply 10 to stabilize the resultant current output $I_L$ from power supply 10.

In accordance with the subject invention, stabilization of a very high current, on the order of 200 amperes as is used in a magnetic resonance imaging magnet, is achieved to the order of one part per million or better through use of a DC current transformer which employs an iron magnetic core. This DC current transformer effectively converts the 200 ampere current to a more useful level, for example, on the order of 200 milliamps, and this useful level current is employed without any changes in resistance and thermal electric voltage errors typical in prior art arrangements. An auxiliary feedback network is employed for fast feedback through the utilization of a conventional sense resistor. However, since only fast changes are monitored across that sense resistor, DC stability of this resistor is not important.

Additional advantages and modifications will readily occur to those skilled in the art. The invention in its broader aspects is, therefore, not limited to the specific details, representative apparatus and illustrative example shown and described. Accordingly, departures may be made from such details without departing from the spirit or scope of applicant's general inventive concept.

I claim:

1. A circuit for stabilizing the electromagnet coil current of a magnetic resonance imaging device, comprising:
   a. a variable DC power supply having an output responsive to a control signal;
   b. a DC current transformer, including a ferromagnetic core and a primary winding, for producing a first sample signal which is proportional to current passing through said primary winding;
   c. a sense resistor;
   d. means for passing current from said variable power supply in series through said primary winding, said electromagnet coil of said magnetic resonance device, and said sense resistor;
   e. means for obtaining a second sample signal which is proportional to change in the value of voltage developed across said sensing resistor; and
   f. means, responsive to said first and second sample signals, for producing said current control signal for said variable DC power supply to provide a stable current to said electromagnet coil.

2. The circuit of claim 1 wherein said means for obtaining a second sample signal comprises a resistive/capacitive circuit connected in parallel to said sense resistor.

3. The circuit of claim 2 wherein said DC current transformer has a response rate slower than about 1 millisecond and said resistive/capacitive circuit has a response rate faster than about 1 millisecond.

4. A circuit for stabilizing the electromagnet coil current of a magnetic resonance imaging device, comprising:
   a. a first resistor;
   b. a second resistor;
   c. a variable DC power supply having an output responsive to a control signal;
   d. a DC current transformer including a ferromagnetic core and a primary winding, said transformer being adaptive to produce a sample current signal which is proportional to current passing through said primary winding;
   e. a magnetic resonance imaging device electromagnet coil;
   f. means for coupling current from said variable DC current supply through a series combination of said primary winding of said DC current transformer, said electromagnet coil, and said first resistor to produce a first voltage across said first resistor;
   g. means for coupling said sample current signal from said DC current transformer through said second resistor to produce a second voltage across said second resistor; and
   h. means, responsive to the change in value of said first voltage and to the actual value of said second voltage, to produce said control signal for said variable DC power supply, whereby said variable DC power supply provides a stabilized current to said electromagnet coil.

* * * * *